US009748293B1

(12) United States Patent
Li et al.

(10) Patent No.: US 9,748,293 B1
(45) Date of Patent: Aug. 29, 2017

(54) IMAGE SENSOR PACKAGES WITH FOLDED COVER-GLASS SEALING INTERFACE

(71) Applicant: OmniVision Technologies, Inc., Santa Clara, CA (US)

(72) Inventors: En-Chi Li, Hsinchu (TW); Chi-Chih Huang, Hsinchu (TW); Wei-Feng Lin, Hsinchu (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/226,691

(22) Filed: Aug. 2, 2016

(51) Int. Cl.
   *H04N 5/225* (2006.01)
   *H01L 27/146* (2006.01)

(52) U.S. Cl.
   CPC .. *H01L 27/14618* (2013.01); *H01L 27/14683* (2013.01); *H04N 5/2257* (2013.01)

(58) Field of Classification Search
   CPC .............................. H01L 27/146; H04N 5/2257
   USPC ........................................................ 348/340
   See application file for complete search history.

(56) References Cited

U.S. PATENT DOCUMENTS

| 7,327,005 B2 * | 2/2008 | Brechignac | G01D 5/264 257/432 |
| 8,090,250 B2 * | 1/2012 | Lusinchi | G03B 3/00 396/439 |
| 8,902,356 B2 * | 12/2014 | Seo | H01L 27/14618 348/374 |
| 2005/0258518 A1 * | 11/2005 | Yang | H01L 27/14618 257/666 |
| 2010/0033608 A1 * | 2/2010 | Chul | H04N 5/2253 348/294 |
| 2016/0344908 A1 * | 11/2016 | Motomura | G01N 1/28 |

FOREIGN PATENT DOCUMENTS

JP     WO 2015133058 A1 *   9/2015   ............... G01N 1/28

* cited by examiner

*Primary Examiner* — David Vu
*Assistant Examiner* — Brandon Fox
(74) *Attorney, Agent, or Firm* — Lathrop & Gage LLP

(57) ABSTRACT

An image sensor package with a folded cover-glass sealing interface includes (a) an image sensor with a light-receiving surface, (b) a substrate having (i) a recessed surface to which the image sensor is bonded, (ii) a second surface facing in a direction parallel to optical axis of the image sensor, surrounding the recessed surface, and being further than the light-receiving surface from the recessed surface, and (iii) a third surface facing the optical axis, and adjoining and surrounding the second surface, and (c) a cover glass bonded to the substrate with a folded sealing-interface at the second surface and the third surface.

13 Claims, 9 Drawing Sheets

800

```
┌─────────────────────────────────────────────────────────────────────┐
│  BOND TOGETHER A FIRST SUB-SUBSTRATE AND A SECOND SUB-SUBSTRATE TO  │
│  FORM A SUBSTRATE, WHEREIN (A) THE FIRST SUB-SUBSTRATE FORMS AT     │
│  LEAST A PLANAR TOP SURFACE AND A RECESSED SURFACE, (B) THE         │
│  RECESSED SURFACE IS RECESSED FROM THE PLANAR TOP SURFACE, (C)      │
│  THE PLANAR TOP SURFACE INCLUDES THE SECOND SURFACE, (D) THE        │
│  SECOND SUB-SUBSTRATE HAS AN APERTURE TO FORM THE THIRD SURFACE     │
│  AROUND THE APERTURE                                                │
│                               810                                    │
│  ┌───────────────────────────────────────────────────────────────┐  │
│  │  BOND THE SECOND SUB-SUBSTRATE TO PORTION OF THE PLANAR TOP   │  │
│  │  SURFACE ADJOINING THE SECOND SURFACE                         │  │
│  │                           812                                  │  │
│  └───────────────────────────────────────────────────────────────┘  │
└─────────────────────────────────────────────────────────────────────┘
                                  │
                                  ▼
┌─────────────────────────────────────────────────────────────────────┐
│       BOND AN IMAGE SENSOR TO THE RECESSED SURFACE OF THE SUBSTRATE │
│                               820                                    │
└─────────────────────────────────────────────────────────────────────┘
                                  │
                                  ▼
┌─────────────────────────────────────────────────────────────────────┐
│       SEAL A COVER GLASS TO FOLDED SEALING SURFACE OF THE SUBSTRATE │
│                               830                                    │
│  ┌─────────────────────────────┐    ┌─────────────────────────────┐ │
│  │ SEAL THE SECOND SURFACE TO A│    │ SEAL THE THIRD SURFACE TO   │ │
│  │ BOTTOM SURFACE OF THE COVER │    │ SIDES OF THE COVER GLASS    │ │
│  │ GLASS                       │    │           834               │ │
│  │           832               │    │                             │ │
│  └─────────────────────────────┘    └─────────────────────────────┘ │
│  ┌───────────────────────────────────────────────────────────────┐  │
│  │    GLUE THE SECOND AND THIRD SURFACES TO THE COVER GLASS      │  │
│  │                           836                                  │  │
│  └───────────────────────────────────────────────────────────────┘  │
└─────────────────────────────────────────────────────────────────────┘
```

IMAGE SENSOR PACKAGES WITH FOLDED COVER-GLASS SEALING INTERFACE

BACKGROUND

There is a constant demand for ever-smaller camera modules. This demand is in large part driven by a desire to shrink the size of systems to which cameras are incorporated, such as cellular phones, but also by cost considerations since the material cost decreases with camera size. There are numerous obstacles for shrinking the size of camera modules. Some of these obstacles are associated with the image sensor itself, whereas others are associated with packaging of the camera. A typical prior-art image sensor package 100 is shown in FIG. 1. Image sensor package 100 includes (a) a substrate 120, (b) an image sensor 110 bonded to a recessed surface 122 of substrate 120, and (c) a cover glass 130 bonded to a top surface 124 of substrate 120. Cover glass 130 protects image sensor 110 against moisture, dirt, and other potential damage. Cover glass 130 is sealed to top surface 124 at a planar sealing interface 140. This sealing interface 140 must have a certain width 144 to both reliably bond cover glass 130 to substrate 120 and prevent, or at least minimize, penetration of moisture through the glue used to seal cover glass 130 to substrate 120. The transverse extent 150 of prior-art image sensor package 130 is the sum of (i) the size 152 of the region required to accommodate image sensor 110 and electrical connections thereto and (ii) two times width 144.

In operation, prior-art image sensor package 100 is coupled with an imaging objective 170 (such as one or more lenses) to form a camera module 190. Imaging objective 170 images a scene 180 through cover-glass 130 onto image sensor 110. Image sensor 110 detects light transmitted by cover glass 130 and incident on the light-receiving surface 112 of image sensor 110.

SUMMARY

In an embodiment, an image sensor package with folded cover-glass sealing interface includes an image sensor with a light-receiving surface, and a substrate having (a) a recessed surface to which the image sensor is bonded, (b) a second surface facing in a direction parallel to optical axis of the image sensor, surrounding the recessed surface, and being further than the light-receiving surface from the recessed surface, and (c) a third surface facing the optical axis, and adjoining and surrounding the second surface. The image sensor package further includes a cover glass bonded to the substrate with a folded sealing-interface at the second surface and the third surface.

In an embodiment, a method for sealing a cover glass to a substrate of an image sensor package may include sealing the cover glass to a second surface and a third surface of the substrate. The second surface faces in a first direction parallel to the optical axis of the image sensor, surrounds a recessed surface of the substrate to which an image sensor is bonded, and is further than the light-receiving surface of the image sensor from the recessed surface. The third surface faces in directions substantially orthogonal to the optical axis, and adjoins and surrounds the second surface such that the second surface and the third surface accommodate a folded sealing interface between the cover glass and the substrate.

BRIEF DESCRIPTION OF THE DRAWINGS

FIG. 8 illustrates a method for sealing a cover glass to a substrate of an image sensor package, wherein the cover glass is at least partly nested in the substrate to form a folded sealing interface therebetween, according to an embodiment.

DETAILED DESCRIPTION OF THE EMBODIMENTS

Figure 1:
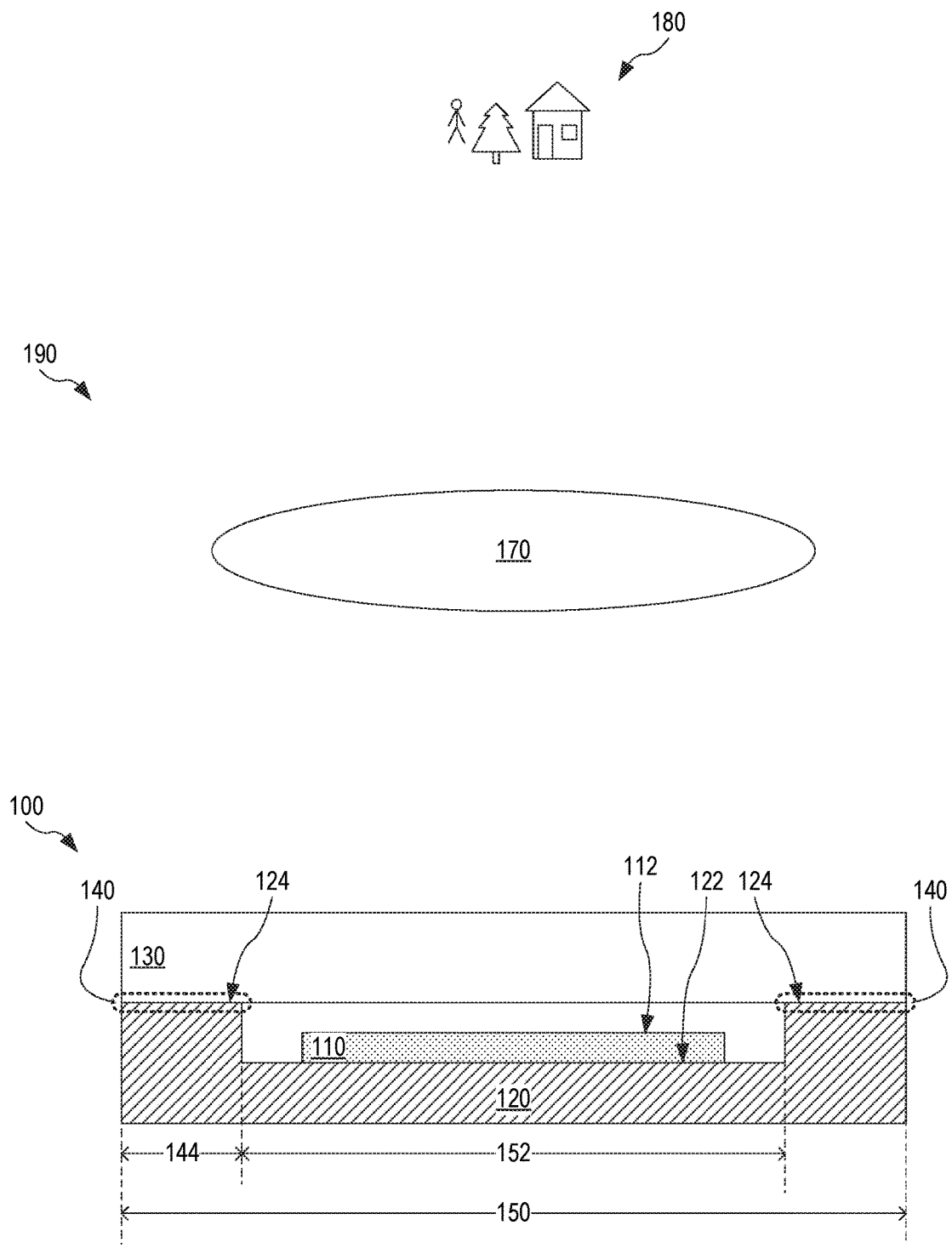
FIG. 1 illustrates a prior at image sensor package having a planar cover-glass sealing interface.
Figure 2A:
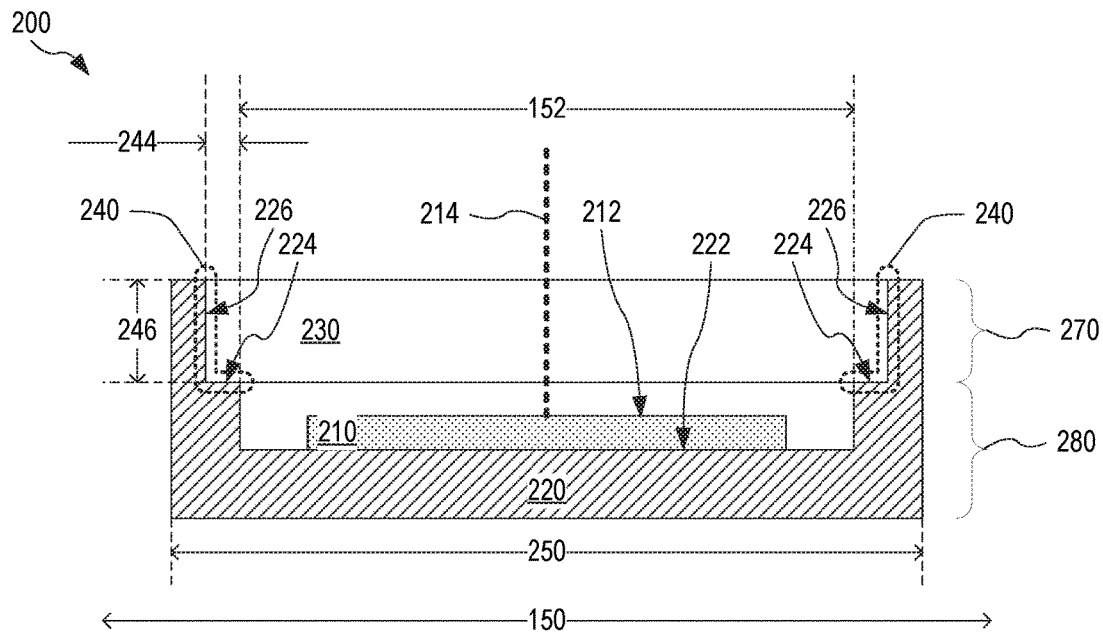
FIGS. 2A and 2B illustrate an image sensor package with a cover glass at least partly nested within an image sensor substrate to form a folded cover-glass sealing interface therebetween, according to an embodiment.
Figure 2B:
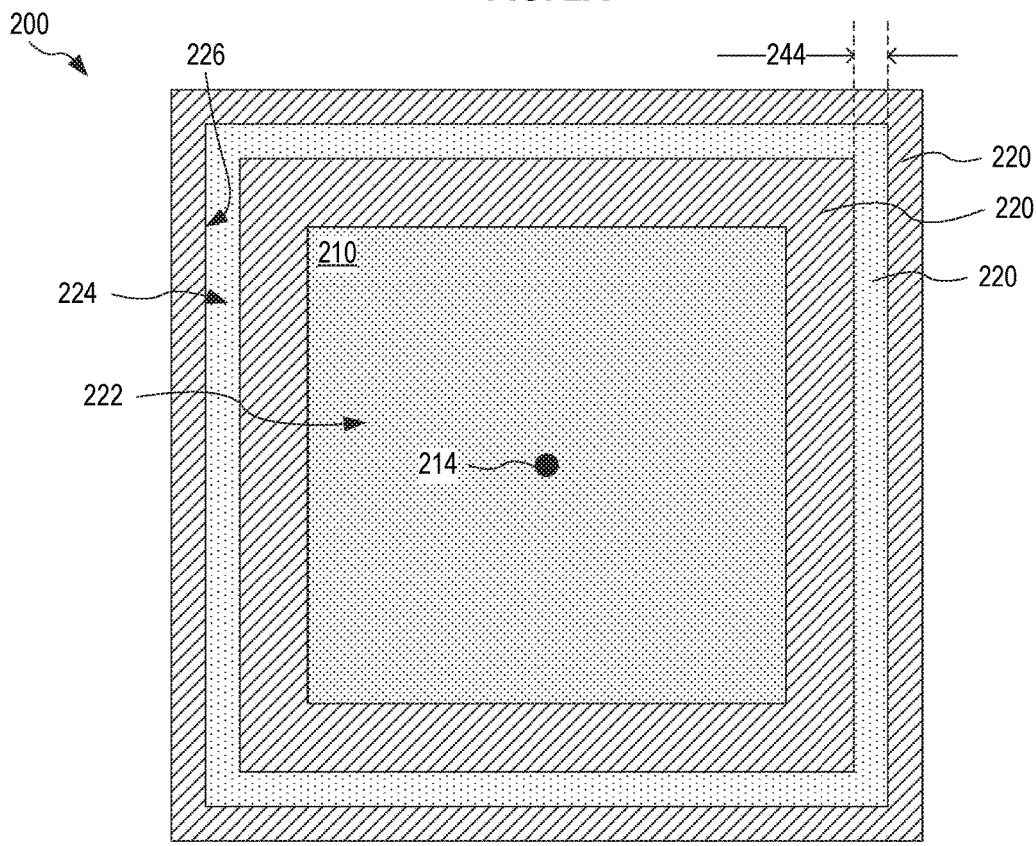

FIGS. 2A and 2B illustrate one exemplary image sensor package 200 with a cover glass at least partly nested within an image sensor substrate to form a folded cover-glass sealing interface therebetween. This folded cover-glass sealing interface enables shrinking the transverse dimensions of image sensor package 200, as compared to conventional prior art image sensor packages such as prior art image sensor package 100, while providing a sufficiently large sealing interface to properly protect the image sensor. Image sensor package 200 includes an image sensor 210, a substrate 220, and a cover glass 230. Image sensor 210 is bonded to a recessed surface 222 of substrate 220. Cover glass 230 is at least partly nested in substrate 220 and sealed to a shelf in substrate 220. FIG. 2A shows image sensor package 200 in cross-sectional side view, with the cross section taken in a plane that includes optical axis 214 of image sensor 210. FIG. 2B is a top view of image sensor package 200 along a viewing direction parallel to optical axis 214 from above cover glass 230. For clarity of illustration, cover glass 230 is not shown in FIG. 2B. FIGS. 2A and 2B are best viewed together.

Substrate 220 includes a carrier portion 280 and a dam portion 270 to form a shelf that surrounds recessed surface 222. This shelf is composed of a second surface 224 and a third surface 226. Second surface 224 surrounds recessed surface 222 and is raised above recessed surface 222 to a height above light-receiving surface 212 of image sensor 210. Second surface 224 faces in a direction substantially parallel to optical axis 214 and is substantially parallel to recessed surface 222. Third surface 226 surrounds and adjoins second surface 224. Third surface 226 faces optical axis 214. Third surface 226 is substantially parallel to optical axis 214 and substantially orthogonal to second surface 224. Second surface 224 and third surface 226 cooperate to provide a folded sealing interface 240 for bonding together substrate 220 and cover glass 230. Herein, a "sealing interface" refers to an interface between two objects. These two objects may be in direct contact with each other, or be bonded to each other via an adhesive such that an adhesive layer exists at the sealing interface.

Since third surface 226 does not add to the transverse extent 250 of image sensor package 200, transverse extent 250 of image sensor package 200 may be made smaller than transverse extent 150 of prior art image sensor package 100. Second surface 224 has width 244 in directions away from image sensor 210 and parallel to sides of image sensor 210. Third surface 226 has height 246. Second surface 224 and third surface 226 combine to provide an effective width of folded sealing interface 240 when following the contour of folded sealing interface 240. This effective width is the sum of width 244 and height 246, assuming orthogonality between second surface 224 and third surface 226. Any path following the contour of folded sealing interface 240 in a direction away from optical axis 214 has a path length that is at least the sum of width 244 and height 246, i.e., the sum of width 244 and height 246 is the minimum extent of folded sealing interface 240. However, height 246 does not contribute to transverse extent 250. Transverse extent 250 may therefore be made smaller than transverse extent 150 (of prior art image sensor package 100) by twice the value of height 246, while still achieving the same effective width of folded sealing interface 240 as the width of planar sealing interface 140 (of prior art image sensor package 100). This comparison is illustrated by reproduction of transverse extent 150 in FIG. 2A, when assuming that recessed surface 222 has transverse extent similar to size 152.

In one embodiment, folded sealing interface 240 is simply connected. In this embodiment, there are no interruptions or missing areas in the seal between cover glass 230 and substrate 220 within the area of second surface 224 and third surface 226. Herein, a "simply connected" interface (or surface) is an interface (or surface) that does not have any holes in it. This definition is consistent with the formal mathematical definition of "simply connected". In another embodiment, folded sealing interface 240 may have minor interruptions or holes caused by imperfections in the bond formed between cover glass 230 and substrate 220. Such imperfections may occur when using standard manufacturing processes and are not expected to significantly compromise the protection of image sensor 210 provided by cover glass 230.

Cover glass 230 may be glued to substrate 220 such that a glue layer exists at folded sealing interface 240. In an embodiment, the sum of width 244 and height 246 is at least one millimeter, for example approximately 1.2 millimeters or greater. This value provides an effective width of folded sealing interface 240 sufficient to (a) properly secure cover glass 230 to substrate 220 and (b) prevent moisture penetration from outside image sensor package 200, through glue at folded sealing interface 240, and into image sensor 210, or at least prevent such moisture penetration from reaching a level that affects the functionality of image sensor 210 under normal operating conditions. In one implementation of this embodiment, (a) width 244 is no more than 0.5 millimeters, for example in the range between 0.3 and 0.45 millimeters, (b) height 246 is at least 0.7 millimeters, for example in the range between 0.75 and 0.9 millimeters, and (c) the sum of width 244 and height 246 is at least 1.2 millimeters. Outside these ranges for width 244 and height 246, the structural integrity of substrate 220 and/or cover glass 230 may be compromised, especially when attaching cover glass 230 to substrate 220. In addition, larger values of width 244 and/or height 246 may negate the size advantages achieved through folded sealing interface 240. Transverse extent 250 is for example in the range between 5 and 25 millimeters.

Although FIG. 2A shows the top surface of cover glass 230, facing away from image sensor 210, as being flush with the top surface of substrate 220, cover glass 230 may protrude out of substrate 220 or be recessed inside substrate 220, without departing from the scope hereof. In one such example, the height of cover glass 230 is greater than height 246. In another such example, the height of substrate 220 above second surface 224 is greater than height 246.

It is understood that second surface 224 may deviate from being parallel with recessed surface 222, without departing from the scope hereof. Such deviation may be caused by manufacturing tolerances. In one example, second surface 224 deviates from being parallel with recessed surface 222 by no more than 5 degrees Likewise, third surface 226 may deviate from being parallel with optical axis 214, without departing from the scope hereof. Such deviation may be caused by manufacturing tolerances or be intentional. In one example, third surface 226 deviates from being parallel with optical axis 214 by no more than 5 degrees or by no more than 15 degrees.

Figure 3A:
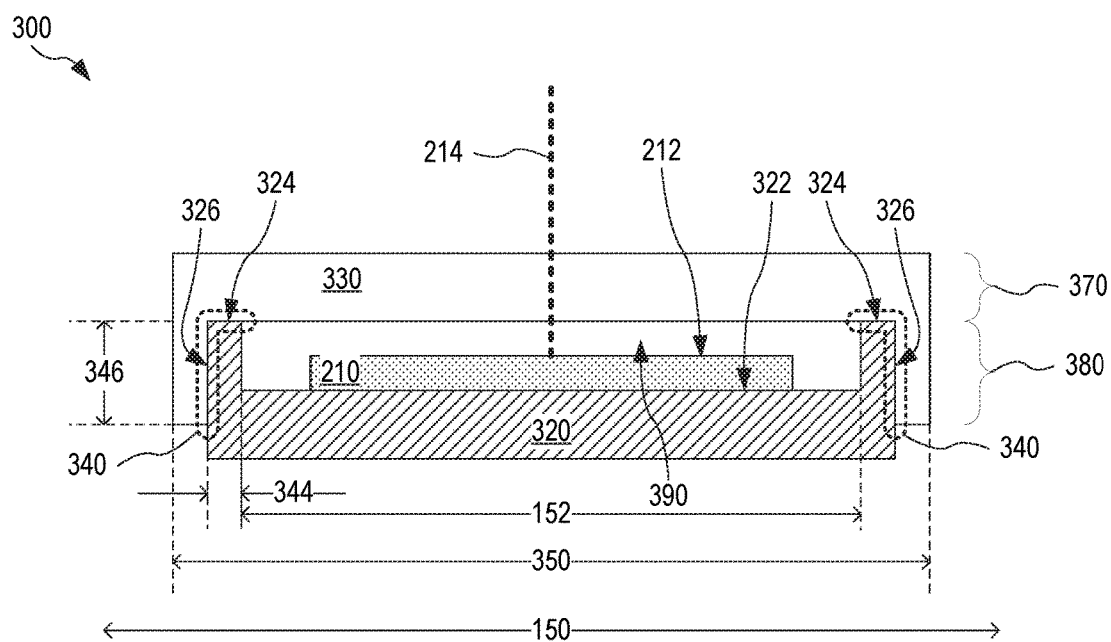
FIGS. 3A and 3B illustrate an image sensor package with an image sensor substrate at least partly nested in a cap-shaped cover glass to form a folded cover-glass sealing interface therebetween, according to an embodiment.
Figure 3B:
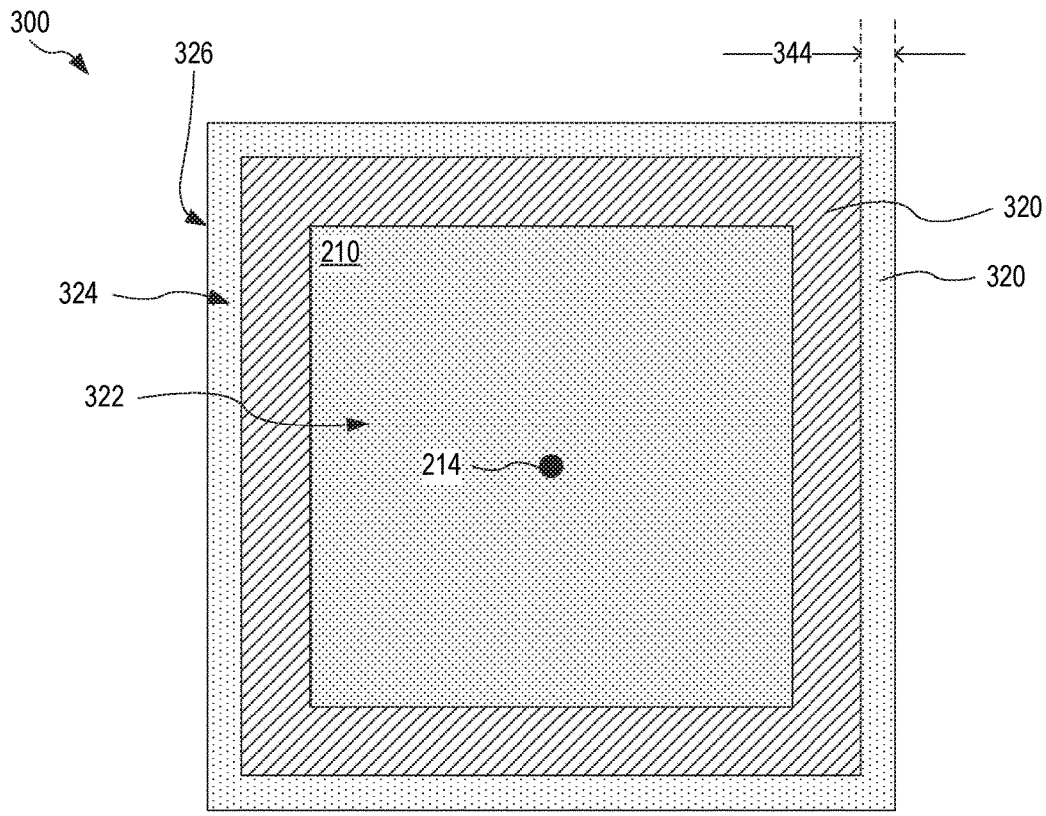

FIGS. 3A and 3B illustrate one exemplary image sensor package 300 with an image sensor substrate at least partly nested in a cap-shaped cover glass to form a folded coverglass sealing interface therebetween. This folded cover-glass sealing interface has the same advantages over the prior art planar sealing interfaces as discussed above in reference to FIGS. 2A and 2B. Image sensor package 300 includes image sensor 210, a substrate 320, and a cap-shaped cover glass 330. Image sensor 210 is bonded to a recessed surface 322 of substrate 320. Recessed surface 322 is similar to recessed surface 222 of substrate 220. Cap-shaped cover glass 330 extends down over the outward-facing surfaces of substrate 320, such that substrate 320 is at least partly nested in cap-shaped cover glass 330. FIG. 3A shows image sensor package 300 in cross-sectional side view, with the cross section taken in a plane that includes optical axis 214 of image sensor 210. FIG. 3B is a top view of image sensor package 300 along a viewing direction parallel to optical axis 214 from above cap-shaped cover glass 330. For clarity of illustration, cap-shaped cover glass 330 is not shown in FIG. 3B. FIGS. 3A and 3B are best viewed together.

Substrate 320 includes a second surface 324 that surrounds recessed surface 322 and is raised above recessed surface 322 to a height above light-receiving surface 212 of image sensor 210. Second surface 324 is similar to second surface 224 but may have different dimensions. Second surface 324 faces in a direction substantially parallel to optical axis 214 and is substantially parallel to recessed surface 322. Substrate 320 further includes an outward-facing third surface 326 that surrounds and adjoins second surface 324. Third surface 326 faces away from optical axis 214. Third surface 326 is substantially parallel to optical axis 214 and substantially orthogonal to second surface 324. Second surface 324 and third surface 326 cooperate to provide a folded sealing interface 340 for bonding together substrate 320 and cap-shaped cover glass 330.

Cap-shaped cover glass 330 includes (a) a planar portion 370 with a planar surface that interfaces with second surface 324 at folded sealing interface 340 and surrounds optical axis 214, and (b) a rim 380 that extends away from the planar surface interfacing with second surface 324. Rim 380 has an inward-facing surface that faces optical axis 214, surrounds optical axis 214, and interfaces with third surface 326 at folded sealing interface 340.

In terms of cover glass-to-substrate sealing, outward-facing third surface 326 performs a function similar to that performed by inward-facing third surface 226 in image sensor package 200. Since third surface 326 does not add to the transverse extent 350 of image sensor package 300, transverse extent 350 of image sensor package 300 may be made smaller than transverse extent 150 of prior art image sensor package 100. Second surface 324 has width 344 in directions away from image sensor 210 and parallel to sides of image sensor 210. Third surface 326 has height 346. Second surface 324 and third surface 326 combine to provide an effective width of folded sealing interface 340 when following the contour of folded sealing surface 340. This effective width is the sum of width 344 and height 346, assuming orthogonality between second surface 324 and third surface 326. Any path following the contour of folded sealing interface 340 in a direction away from optical axis 214 has a path length that is at least the sum of width 344 and height 346, i.e., the sum of width 344 and height 346 is the minimum extent of folded sealing interface 340. However, height 346 does not contribute to transverse extent 350. Transverse extent 350 may therefore be made smaller than transverse extent 150 (of prior art image sensor package 100) by twice the value of height 346, while still achieving the same effective width of folded sealing interface 340 as the width of planar sealing interface 140 (of prior art image sensor package 100). This comparison is illustrated by reproduction of transverse extent 150 in FIG. 3A, when assuming that recessed surface 322 has transverse extent similar to size 152.

In one embodiment, folded sealing interface 340 is simply connected. In this embodiment, there are no interruptions or missing areas in the seal between cap-shaped cover glass 330 and substrate 320 within the area of second surface 324 and third surface 326. In another embodiment, folded sealing interface 340 may have minor interruptions or holes caused by imperfections in the bond formed between cap-shaped cover glass 330 and substrate 320, as discussed above in reference to FIGS. 2A and 2B.

Cap-shaped cover glass 330 may be glued to substrate 320 such that a glue layer exists at folded sealing interface 340. In an embodiment, the sum of width 344 and height 346 is at least one millimeter, for example approximately 1.2 millimeters or greater. This value provides an effective width of folded sealing interface 340 sufficient to (a) properly secure cap-shaped cover glass 330 to substrate 320 and (b) prevent moisture penetration from outside image sensor package 300, through glue at folded sealing interface 340, and into image sensor 310, or at least prevent such moisture penetration from reaching a level that affects the functionality of image sensor 310 under normal operating conditions. In one implementation of this embodiment, (a) width 344 is at least 0.15 millimeters, for example in the range between 0.15 and 0.45 millimeters, (b) height 346 is for example in the range between 0.75 and 1.05 millimeters, and (c) the sum of width 344 and height 346 is at least 1.2 millimeters. Outside these ranges for width 344 and height 346, the structural integrity of cap-shaped cover glass 330 may be compromised, especially when manufacturing cap-shaped cover glass 330 or attaching cap-shaped cover glass 330 to substrate 320. In addition, larger values of width 344 and/or height 346 may negate the size advantages achieved through folded sealing interface 340. Transverse extent 350 is for example in the range between 5 and 25 millimeters.

Although FIG. 3A shows substrate 320 as protruding from cap-shaped cover glass 330, the bottom surface of substrate 320, facing away from image sensor 210, may be flush with cap-shaped cover glass 330, without departing from the scope hereof. In one such example, the height of each of rim 380 and substrate 320 is the same as height 346.

It is understood that second surface 324 may deviate from being parallel with recessed surface 322, without departing from the scope hereof. Such deviation may be caused by manufacturing tolerances. In one example, second surface 324 deviates from being parallel with recessed surface 322 by no more than 5 degrees Likewise, third surface 326 may deviate from being parallel with optical axis 214, without departing from the scope hereof. Such deviation may also be caused by manufacturing tolerances. In one example, third surface 326 deviates from being parallel with optical axis 214 by no more than 5 degrees.

Figure 4:
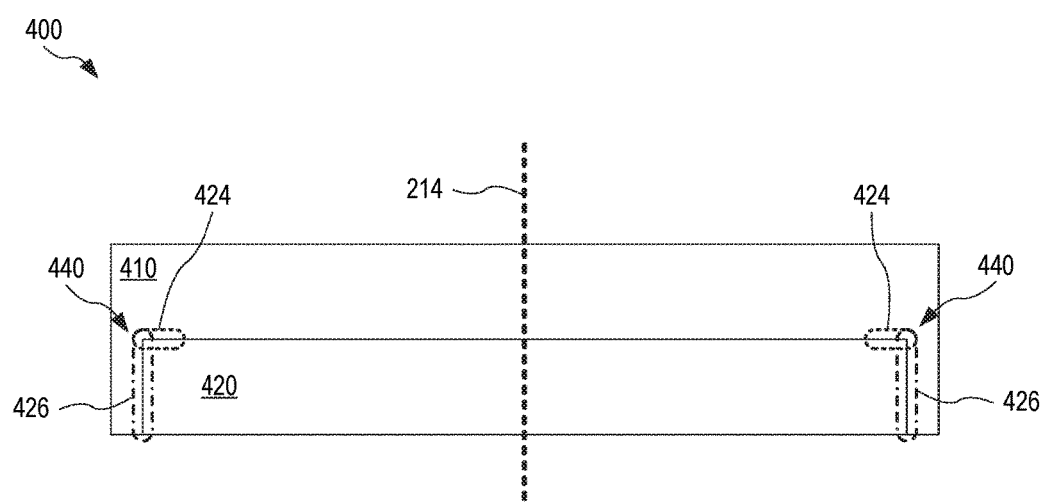
FIG. 4 is a schematic diagram of an image sensor package having a folded cover-glass sealing interface, according to an embodiment.

FIG. 4 is a schematic diagram of one exemplary image sensor package 400 that embodies both image sensor package 200 and image sensor package 300. Image sensor package 400 includes two structures 410 and 420 sealed to each other at a folded sealing interface 440. One of structures 410 and 420 is a substrate with an image sensor, while the other one of structures 410 and 420 is a cover glass.

In one embodiment, which embodies image sensor package 200, structure 410 is a substrate with an image sensor bonded thereto, and structure 420 is a cover glass at least partly nested in the substrate of structure 410. In another embodiment, which embodies image sensor package 300, structure 410 is a cap-shaped cover glass, and structure 420 is a substrate at least partly nested in structure 410 and having an image sensor bonded thereto. In either one of these two embodiments, folded sealing interface 440 includes (a) an interface portion 424 that is substantially orthogonal to optical axis 214 of the image sensor of image sensor package 400, and (b) an interface portion 426 that is substantially parallel to optical axis 214. Interface portion 424 surrounds optical axis 214. Interface portion 426 adjoins and surrounds interface portion 424.

Figure 5:
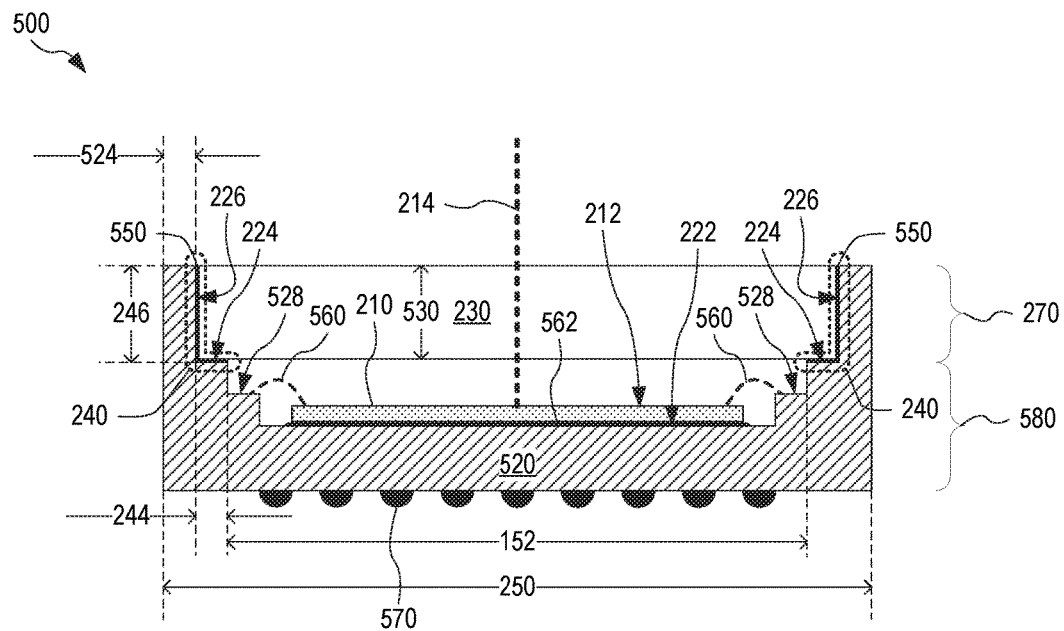
FIG. 5 illustrates another image sensor package with a cover glass at least partly nested within an image sensor substrate to form a folded cover-glass sealing interface therebetween, according to an embodiment.

FIG. 5 illustrates one exemplary image sensor package 500 that is an embodiment of image sensor package 200. FIG. 5 shows image sensor package 500 in cross sectional view, similar to the view used in FIG. 2A. Image sensor package 500 includes image sensor 210, a substrate 520, and cover glass 230. Substrate 520 is an embodiment of substrate 220. Image sensor package 500 implements folded sealing interface 240 as discussed above in reference to FIGS. 2A and 2B.

In image sensor package 500, cover glass 230 is glued to substrate 520 such that a glue layer 550 exists at folded sealing interface 240. In an embodiment, glue layer 550 is simply connected and spans all of folded sealing interface 240. In another embodiment, one or more minor areas of folded sealing interface 240 are free of glue without compromising the integrity of folded sealing interface 240, as discussed above in reference to FIGS. 2A and 2B. The glue forming glue layer 550 may be cured through exposure to ultraviolet light and a subsequent heat and/or time cure. The thickness of glue layer 550 is typically less than 0.25 microns.

Substrate 520 includes dam portion 270 and a carrier portion 580. Carrier portion 580 is an embodiment of carrier portion 280. Carrier portion 580 may include an additional shelf 528 for accommodating wire bonds 560 between image sensor 510 and substrate 520, for example to electrically connect image sensor 210 to optional solder balls 570 on the surface of substrate 520 facing opposite recessed surface 222. In one embodiment, material portions of dam portion 270 have width 524 of approximately 0.3 millimeters, and height 246 is no more than 0.9 millimeters, to ensure the structural integrity of dam portion 270. In another embodiment, height 246 is increased beyond 0.9 millimeters and width 524 is increased as well, to maintain the aspect ratio of the material portion of dam portion 270 within a structurally stable range. In one example of this embodiment, width 524 is in the range between 0.3 and 0.5 millimeters to take advantage of the reduction in transverse extent facilitated by folded sealing interface 240, and height 246 is no more than three times width 524 to ensure the structural integrity of dam portion 270.

In image sensor package 500, cover glass 230 has thickness 530 of at least 0.75 millimeters, for example in the range between 0.8 and 0.9 millimeters. For comparison, a conventional cover glass, such as cover glass 130 of prior art image sensor package 100, generally have thickness of only about 0.5 millimeters. The increased thickness of cover glass 230 allows for a large fraction of folded sealing interface 240 being substantially parallel to optical axis 214, which in turns facilitates a smaller transverse extent 250 as compared to transverse extent 150 of prior art image sensor package 100. Although FIG. 5 shows the top surfaces of cover glass 230 and substrate 520 as being coplanar, these two surfaces may be offset from each other, as discussed above in reference to FIGS. 2A and 2B.

Image sensor 210 may be glued onto recessed surface 222 with a glue layer 562.

Figure 6:
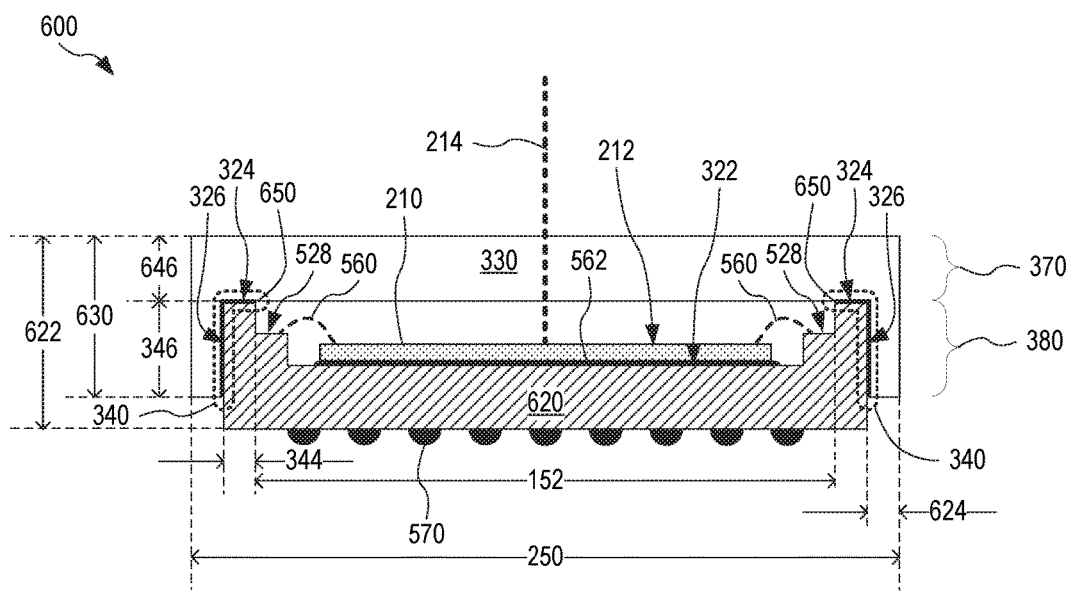
FIG. 6 illustrates another image sensor package with an image sensor substrate at least partly nested in a cap-shaped cover glass to form a folded cover-glass sealing interface therebetween, according to an embodiment.

FIG. 6 illustrates one exemplary image sensor package 600 that is an embodiment of image sensor package 300. FIG. 6 shows image sensor package 600 in cross sectional view, similar to the view used in FIG. 3A. Image sensor package 600 includes image sensor 210, a substrate 620, and cap-shaped cover glass 330. Substrate 620 is an embodiment of substrate 320. Image sensor package 600 implements folded sealing interface 340 as discussed above in reference to FIGS. 3A and 3B.

In image sensor package 600, cap-shaped cover glass 330 is glued to substrate 620 such that a glue layer 650 exists at folded sealing interface 340. In an embodiment, glue layer 650 is simply connected and spans all of folded sealing interface 340. In another embodiment, one or more minor areas of folded sealing interface 340 are free of glue without compromising the integrity of folded sealing interface 340, as discussed above in reference to FIGS. 3A and 3B. The material properties of glue layer 650 may be similar to those of glue layer 550.

Substrate 620 may include one or more of shelf 528, wire bonds 560, and solder balls 570 as discussed above in reference to FIG. 5. In image sensor package 600, planar portion 370 of cap-shaped cover glass 330 may have thickness 646 in the range between 0.4 and 0.7 millimeters, for example approximately 0.55 millimeters. In image sensor package 600, the total height of cap-shaped cover glass 330, i.e., the sum of heights 346 and 646, may be in the range between 1.15 and 1.8 millimeters. In one implementation, the total height of cap-shaped cover glass 330 is approximately 1.45 millimeters. In image sensor package 600, image sensor 210 may be glued onto recessed surface 322 with glue layer 562.

Figure 7:
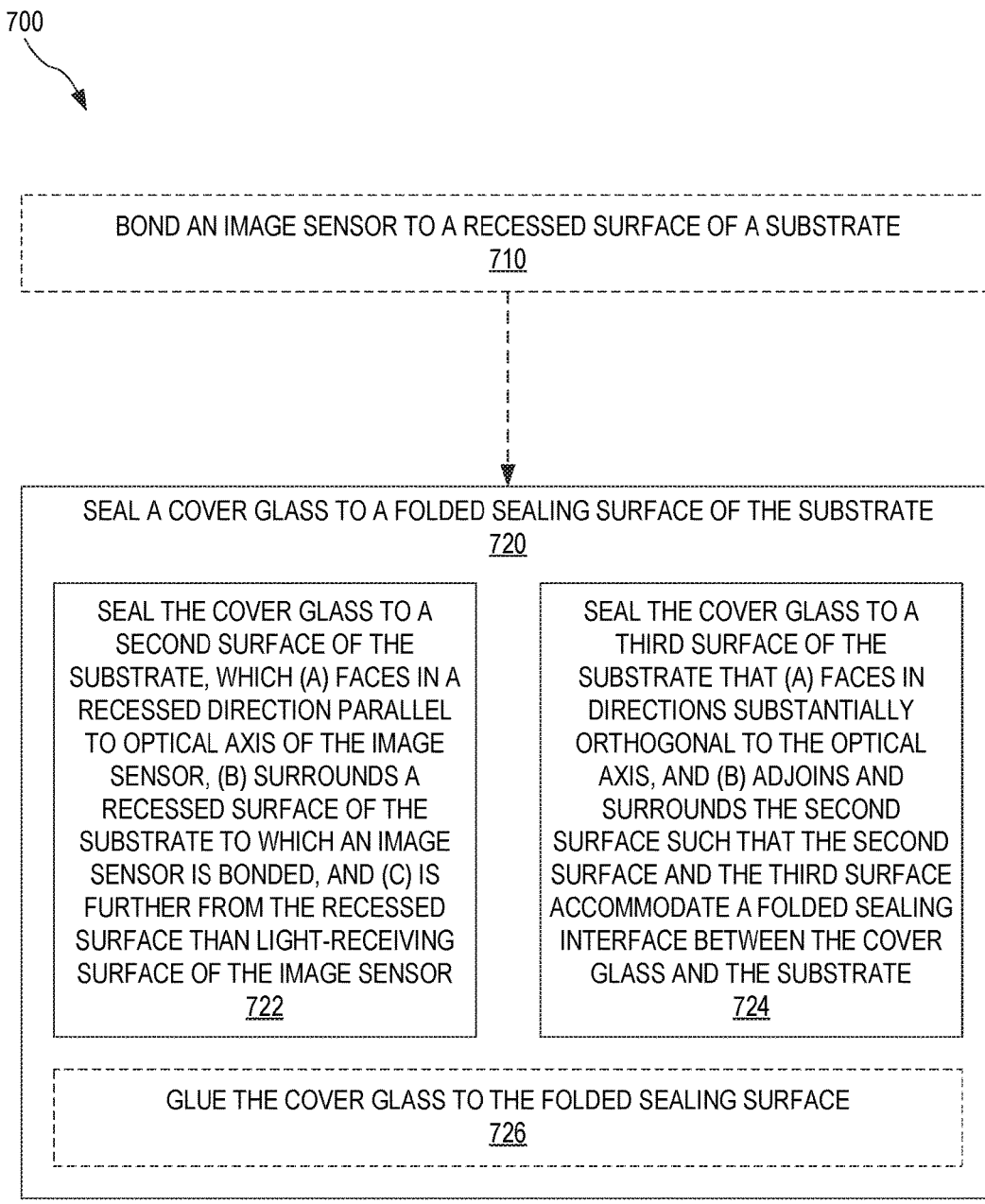
FIG. 7 illustrates a method for sealing a cover glass to a substrate of an image sensor package with a folded sealing interface therebetween, according to an embodiment.

FIG. 7 illustrates one exemplary method 700 for sealing a cover glass to a substrate of an image sensor package with a folded sealing interface therebetween. Method 700 utilizes a folded sealing interface between the cover glass and the substrate to enable forming an image sensor package of reduced transverse extent, as compared to conventional prior art image sensor packages with a planar sealing interface (such as prior art image sensor package 100). Method 700 may be used in the manufacturing of any one of image sensor packages 200, 300, 400, 500, and 600.

In an embodiment, method 700 includes a step 710 of bonding an image sensor to a recessed surface of a substrate. In an example of step 720, image sensor 210 is bonded to recessed surface 222 of substrate 220 or to recessed surface 322 of substrate 320. In another embodiment, method 700 does not include step 710 but rather receives the substrate with the image sensor already bonded thereto.

In a step 720, method 700 seals a cover glass to a folded sealing surface of the substrate. Step 720 includes steps 722 and 724. Step 722 seals the cover glass to a second surface of the substrate, wherein this second surface (a) faces in a first direction parallel to the optical axis of the image sensor, (b) surrounds the recessed surface of the substrate to which the image sensor is bonded, and (c) is further from the recessed surface than the light-receiving surface of the image sensor. Step 724 seals the cover glass to a third surface of the substrate, wherein this third surface faces in directions substantially orthogonal to the optical axis, and adjoins and surrounds the second surface, such that the second surface and the third surface accommodate a folded sealing interface between the cover glass and the substrate. Steps 722 and 724 may be performed simultaneously. In one example of step 720, cover glass 230 is sealed to second surface 224 and third surface 226 of substrate 220 at folded sealing interface 240. Second surface 224 and third surface 226 form a folded sealing surface. In another example of step 720, cap-shaped cover glass 330 is sealed to second surface 324 and third surface 326 of substrate 320 at folded sealing interface 340. Second surface 324 and third surface 326 form a folded sealing surface.

In certain embodiments, step 720 implements a step 726 of gluing the cover glass to the folded sealing surface. Step 726 is performed as an integrated portion of steps 724 and 726. Step 726 may utilize a glue that cures via exposure to ultra-violet light and a subsequent heat and/or time cure.

FIG. 8 illustrates one exemplary method 800 for sealing a cover glass to a substrate of an image sensor package, wherein the cover glass is at least partly nested in the substrate to form a folded sealing interface therebetween. Method 800 is an embodiment of method 700 and may be used in the manufacturing of image sensor packages 200, 400, and 500.

In a step 810, method 800 forms a substrate with a folded sealing surface for sealing the cover glass thereto. Step 810 includes bonding together a first sub-substrate and a second sub-substrate. The first sub-substrate forms at least a planar top surface and the recessed surface discussed in method 700, wherein the recessed surface is recessed from the planar top surface and the planar top surface includes the second surface discussed in method 700. The second sub-substrate has an aperture to form the third surface discussed in method 700 around the aperture. Step 810 includes a step 812 of bonding the first sub-substrate to a portion of the planar top surface adjoining the second surface, such that the third surface adjoins the second surface. In one example of step 810, portions 270 and 280 of substrate 220 are bonded together, for example using methods known in the art.

A step 820 bonds an image sensor to the recessed surface of the substrate. Step 820 is an embodiment of step 710. In one example of step 820, image sensor 210 is bonded to recessed surface 222 of substrate 220.

In a step 830, method 800 seals a cover glass to a folded sealing surface of the substrate. Step 830 is an embodiment of step 720. Step 830 includes steps 832 and 834. Step 832 seals the second surface to a bottom surface of the cover glass. Step 834 seals the third surface to sides of the cover glass. Steps 832 and 834 may be performed simultaneously. Steps 832 and 834 are embodiments of steps 722 and 724, respectively. In one example of step 830, a bottom surface of cover glass 230 (facing image sensor 210) is bonded to second surface 224 of substrate 220 and sides of cover glass 230 (facing away from optical axis 214) are bonded to third surface 226 of substrate 220.

In certain embodiments, step 830 implements a step 836 of gluing the cover glass to the folded sealing surface. Step 836 is performed as an integrated portion of steps 824 and 826. Step 836 may utilize a glue that cures via exposure to ultra-violet light and a subsequent heat and/or time cure. Step 836 is an embodiment of step 726. In one example of step 830 implemented with step 836, cover glass 230 is glued to substrate 520 such that glue layer 550 exists at folded sealing interface 240.

Figure 9:
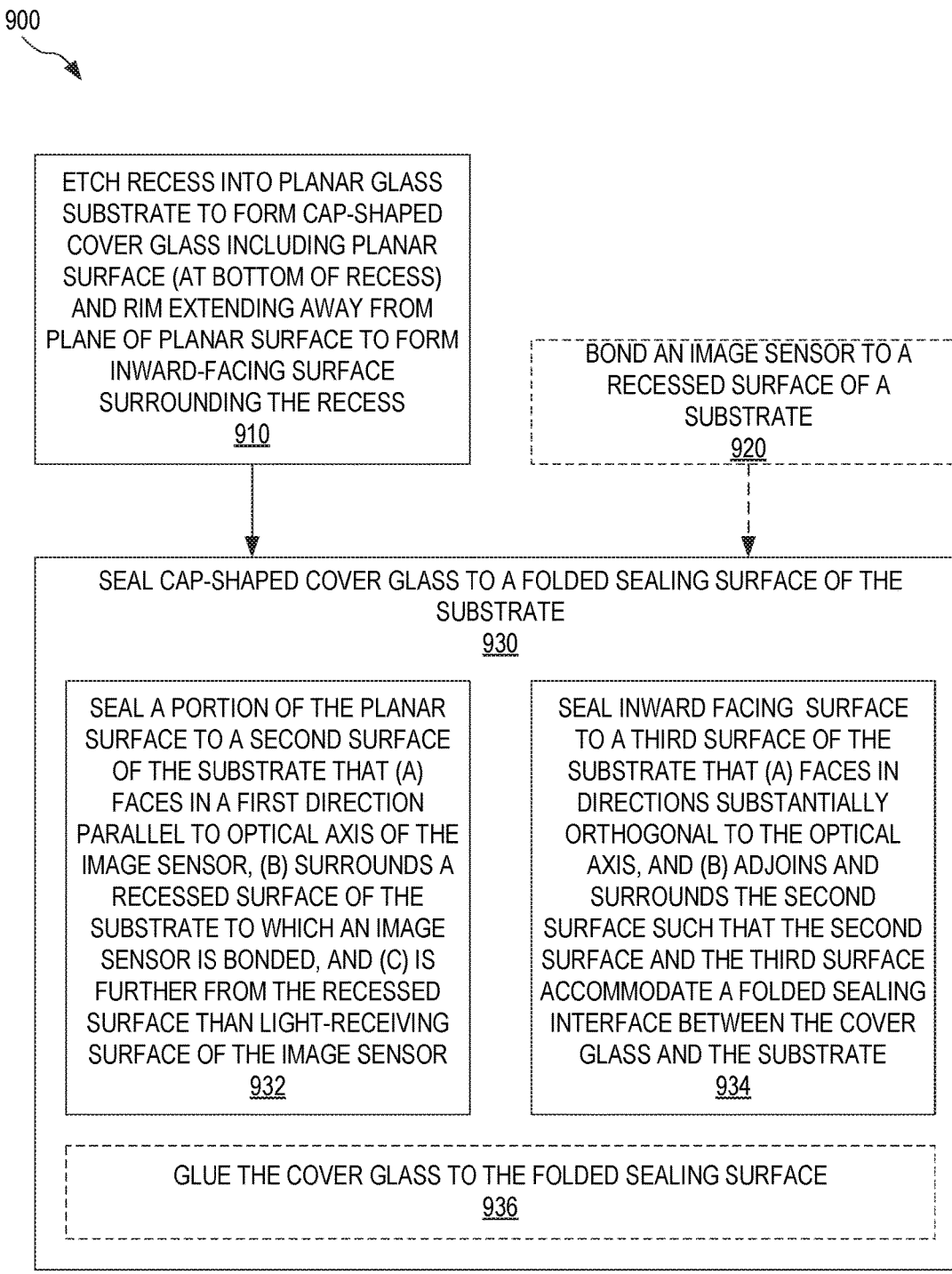
FIG. 9 illustrates a method for sealing a cover glass to a substrate of an image sensor package, wherein the cover glass is cap-shaped and the substrate is at least partly nested in the cap-shaped cover glass to form a folded sealing interface therebetween, according to an embodiment.

FIG. 9 illustrates one exemplary method 900 for sealing a cover glass to a substrate of an image sensor package, wherein the cover glass is cap-shaped and the substrate is at least partly nested in the cap-shaped cover glass to form a folded sealing interface therebetween. Method 900 is an embodiment of method 700 and may be used in the manufacturing of image sensor packages 300, 400, and 600.

In a step 910, method 900 etches a recess into a planar glass substrate to form a cap-shaped cover glass that includes (a) a planar surface at the bottom of the recess and (b) a rim extending away from the plane of this planar surface to form an inward-facing surface surrounding the recess. In one example of step 910, a recess is etched into a planar glass substrate to form cap-shaped cover glass 330. The initial planar glass substrate extends from the top surface of planar portion 370 (facing away from image sensor 210 in FIG. 3A) to the plane of the bottom surface of rim 380. This initially planar glass substrate is etched to form a recess 390 (see FIG. 3A). Step 910 may utilize hydrofluoric acid and achieve a surface flatness very similar to the non-etched surface portions of the glass substrate, such that the optical properties of the glass substrate are not compromised.

Optionally, method 900 includes a step 920 a bonding an image sensor to a recessed surface of a substrate. In one example of step 920, image sensor 210 is bonded to recessed surface 322 of substrate 320. Step 920 is an embodiment of step 710. In embodiments of method 900 not including step 920, method 900 receives the substrate with the image sensor already bonded thereto.

In a step 930, the cap-shaped cover glass of step 910 is bonded to a folded sealing surface of the substrate of step 920. Step 930 includes steps 932 and 934. Step 932 seals a portion of portion of the planar surface, located at the bottom of the recess of the cap-shaped cover glass, to the second surface discussed in method 700. Step 934 seals the inward-facing surface of the cap-shaped cover glass to the third surface discussed in method 700. Steps 932 and 934 may be performed simultaneously. Steps 930, 932, and 934 are embodiments of steps 720, 722, and 724, respectively, of method 700. In one example of step 930, cap-shaped cover glass 330 is sealed to second surface 324 and third surface 326 of substrate 320.

In certain embodiments, step 930 implements a step 936 of gluing the cover glass to the folded sealing surface. Step 936 is performed as an integrated portion of steps 924 and 926. Step 936 may utilize a glue that cures via exposure to ultra-violet light and a subsequent heat and/or time cure. Step 936 is an embodiment of step 726. In one example of step 930 implemented with step 936, cap-shaped cover glass 330 is glued to substrate 620 such that glue layer 650 exists at folded sealing interface 340.

Figure 10:
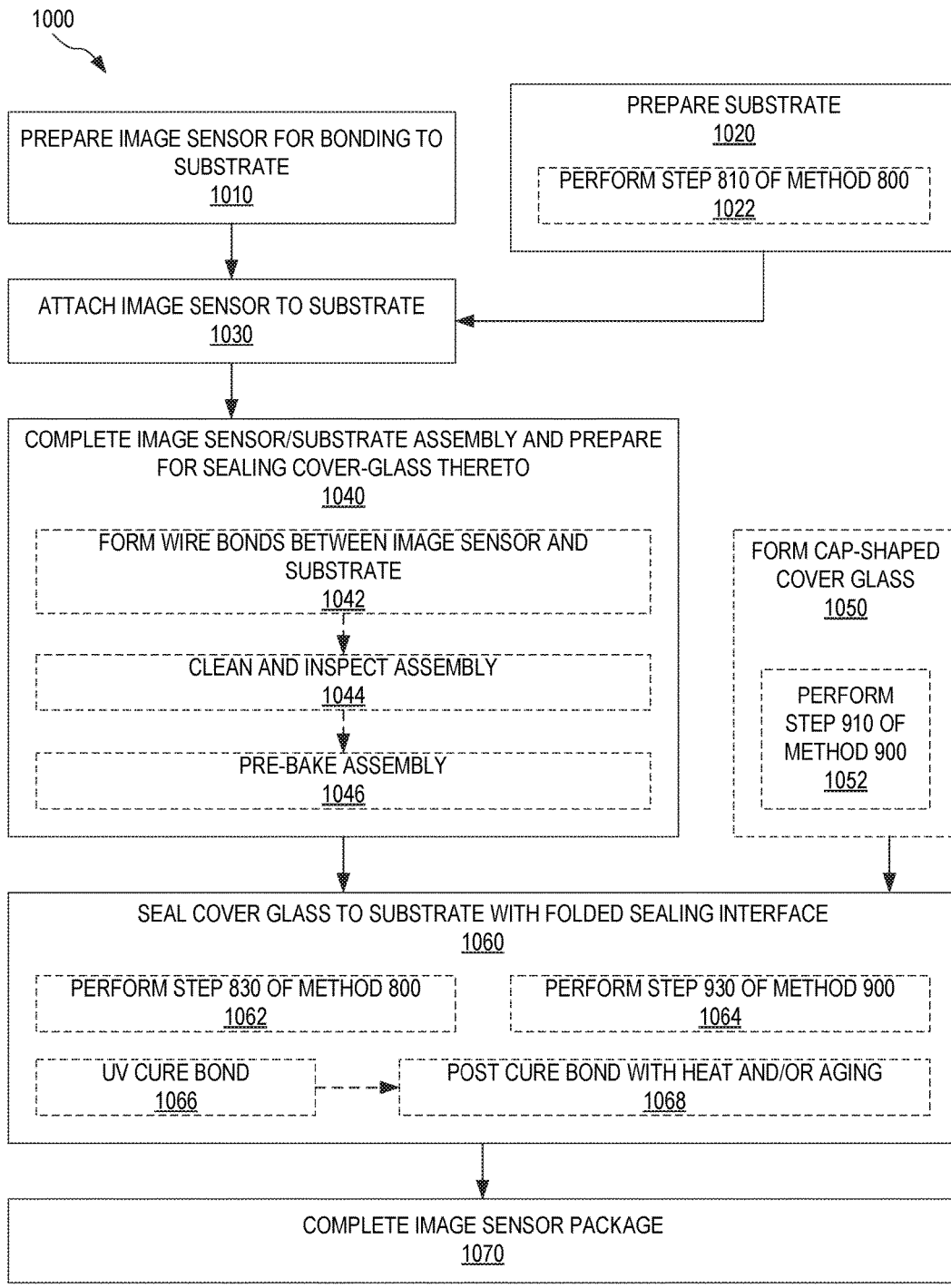
FIG. 10 illustrates a method for manufacturing an image sensor package with a folded cover-glass sealing interface, according to an embodiment.

FIG. 10 illustrates one exemplary method 1000 for manufacturing an image sensor package with a folded cover-glass sealing interface. Method 1000 may be used to manufacture any one of image sensor packages 200, 300, 400, 500, and 600. Method 1000 is an extension of method 700, and may include either one of methods 800 and 900.

In a step 1010, method 1000 prepares an image sensor for bonding to a substrate. In a step 1020, the substrate is prepare for bonding of the image sensor thereto. In a step 1030, the image sensor is attached to the substrate. Steps 1010, 1020, and 1030 may utilize methods known in the art except that, in one embodiment, step 1020 includes a step 1022 of performing step 810 of method 800 to form the substrate with an additional dam portion, such as dam portion 270. In one example of steps 1010, 1020, and 1030, image sensor 210 is attached to recessed surface 222 of substrate 220, or to recessed surface 322 of substrate 320. Step 1030 may utilize glue. For example, image sensor 210 may be bonded to recessed surface 222 or 322 with glue layer 562 therebetween.

In a step 1040, the image sensor/substrate assembly formed by steps 1010, 1020, and 1030 is completed and prepared for sealing of a cover glass thereto. Step 1040 may utilize methods known in the art except that, in one embodiment, step 1040 is performed on an assembly including a substrate with an additional dam portion. In one embodiment, step 1040 includes steps 1042 and 1044, and optionally a step 1046. Step 1042 forms wire bonds between the image sensor and the substrate. In one example of step 1042, wire bonds 560 are formed between image sensor 210 and shelf 528, for example using wire bonding techniques known in the art. Step 1044 cleans and inspects the assembly, for example using methods known in the art. Optional step 1046 pre-bakes the assembly.

A step 1060 seals a cover glass to the substrate of the assembly outputted by step 1040, wherein the sealing interface is folded. Step 1060 may include steps 1066 and 1068. Step 1066 exposes the assembly to ultraviolet light to partly cure a glue bond between the cover glass and the substrate, and step 1068 completes the curing of the glue bond through heat and/or aging. Steps 1066 and 1068 may utilize glues and associated curing methods known in the art.

In embodiments of method 1000 including step 1022, step 1060 includes a step 1062 of performing step 830 of method 800 to at least partly nest the cover glass (such as cover glass 230) in the substrate (such as substrate 220) and seal the cover glass and the substrate together at a folded sealing interface (such as folded sealing interface 240).

In embodiments of method 1000 not including step 1022, step 1060 is preceded by a step 1050 and step 1060 includes a step 1064. Step 1050 forms a cap-shaped cover glass, such as cap-shaped cover glass 330. Step 1050 includes a step 1052 of performing step 910 of method 900. Step 1064 performs step 930 of method 900 to seal the cap-shaped cover glass (such as cap-shaped cover glass 330) to the substrate (such as substrate 320) at a folded sealing interface (such as folded sealing interface 340).

A step 1070 completes the image sensor package. Step 1070 may utilize methods known in the art. For example, step 1070 may include marking and curing the image sensor package, forming solder balls 570, visually inspecting the assembly, and performing a final quality check.

Combinations of Features

Features described above as well as those claimed below may be combined in various ways without departing from the scope hereof. For example, it will be appreciated that aspects of one image sensor package with a folded cover-glass sealing surface, or associated method, described herein may incorporate or swap features of another image sensor package with a folded cover-glass sealing surface, or associated method described herein. The following examples illustrate possible, non-limiting combinations of embodiments described above. It should be clear that many other changes and modifications may be made to the methods and device herein without departing from the spirit and scope of this invention:

(A1) An image sensor package with folded cover-glass sealing interface may include (a) an image sensor including a light-receiving surface, (b) a substrate including (i) a recessed surface to which the image sensor is bonded, (ii) a second surface facing in a direction parallel to the optical axis of the image sensor, surrounding the recessed surface, and being further than the light-receiving surface from the recessed surface, and (iii) a third surface facing the optical axis, and adjoining and surrounding the second surface, and (c) a cover glass bonded to the substrate with a folded sealing-interface at the second surface and the third surface.

(A2) In the image sensor package denoted as (A1), the folded sealing interface may be simply connected.

(A3) In either or both of the image sensor packages denoted as (A1) and (A2), the folded sealing interface may extend at least one millimeter along any path following contour of the folded sealing interface in direction away from the optical axis.

(A4) Any one of the image sensor packages denoted as (A1) through (A3) may further include an adhesive at the folded sealing interface, for bonding the cover glass to the substrate.

(A5) In the image sensor package denoted as (A4), the adhesive may be a glue.

(A6) In any one of the image sensor packages denoted as (A1) through (A5), the third surface may face the optical axis, and the cover glass may be planar and have a bottom surface bonded to the second surface, and sides bonded to the third surface.

(A7) In the image sensor package denoted as (A6), the second surface may have a width, along directions facing away from the image sensor, that is no more than 0.5 millimeters.

(A8) In either or both of the image sensor packages denoted as (A6) and (A7), the third surface may have height of at least 0.75 millimeters.

(A9) In any one of the image sensor packages denoted as (A6) through (A8), the cover glass may have thickness of at least 0.75 millimeters.

(A10) In any one of the image sensors packages denoted as (A6) through (A9), the substrate may include (1) a carrier sub-substrate forming at least a planar top surface and the recessed surface, wherein the recessed surface is recessed from the planar top surface and the planar top surface including the second surface, and (2) a dam sub-substrate bonded to portion of the planar top surface adjoining the second surface, wherein the dam sub-substrate has an aperture to form the third surface around the aperture.

(A11) In any one of the image sensor packages denoted as (A1) through (A5), the third surface may face away from optical axis of the image sensor, and the cover glass may include (1) a planar surface facing the second surface and (2) a rim extending away from plane of the planar surface to form an inward-facing surface that faces in direction toward the optical axis.

(A12) In the image sensor package denoted as (A11), the inward-facing surface may have height, in direction parallel to the optical axis, of at least 0.75 millimeters.

(A13) In either or both of the image sensor packages denoted as (A11) and (A12), the second surface may have a width, along directions away from the optical axis, that is no more than 0.45 millimeters.

(B1) A method for sealing a cover glass to a substrate of an image sensor package may include sealing the cover glass to (a) a second surface of the substrate, which faces in a first direction parallel to the optical axis of the image sensor, surrounds a recessed surface of the substrate to which an image sensor is bonded, and is further than the light-receiving surface of the image sensor from the recessed surface, and (b) a third surface of the substrate, which faces in directions substantially orthogonal to the optical axis, and adjoins and surrounds the second surface such that the second surface and the third surface accommodate a folded sealing interface between the cover glass and the substrate.

(B2) In the method denoted as (B1), the step of sealing may include gluing the cover glass to the recessed surface and the second surface.

(B3) In either of both of the methods denoted as (B1) and (B2), in the step of sealing, the folded sealing interface being simply connected.

(B3) Any one of the methods denoted as (B1) through (B3) may further include, prior to the step of sealing, (1) bonding together a first sub-substrate and a second sub-substrate to form the substrate, wherein (i) the first sub-substrate forms at least a planar top surface and the recessed surface, (ii) the recessed surface is recessed from the planar top surface, (iii) the planar top surface includes the second surface, (iv) the second sub-substrate has an aperture to form the third surface around the aperture, and (v) said bonding includes bonding the first sub-substrate to portion of the planar top surface adjoining the second surface, and (2) bonding the image sensor to the recessed surface.

(B4) In the method denoted as (B3), the step of sealing may include sealing the second surface to a bottom surface of the cover glass, and sealing the third surface to sides of the cover glass.

(B5) Any one of the methods denoted as (B1) through (B3) may further include, prior to the step of sealing, etching a recess into a planar glass substrate to form a cap-shaped cover glass including a planar surface, at bottom of the recess, and a rim extending away from plane of the planar surface to form an inward-facing surface surrounding the recess.

(B6) In the method denoted as (B5), the step of sealing may include sealing a portion of the planar surface to the second surface, and sealing the inward-facing surface to the third surface, wherein the third surface faces away from the optical axis.

Changes may be made in the above systems and methods without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present methods and systems, which, as a matter of language, might be said to fall therebetween.

What is claimed is:

1. An image sensor package with folded cover-glass sealing interface, comprising:
   an image sensor including a light-receiving surface;
   a substrate including:
      a recessed surface to which the image sensor is bonded,
      a second surface facing in a direction parallel to optical axis of the image sensor, surrounding the recessed surface, and being further than the light-receiving surface from the recessed surface, and
      a third surface facing the optical axis, and adjoining and surrounding the second surface; and
   a cover glass bonded to the substrate with a folded sealing interface at the second surface and the third surface, the folded sealing interface being simply connected and extending at least one millimeter along any path following contour of the folded sealing interface in direction away from the optical axis.

2. The image sensor package of claim 1, further including an adhesive at the folded sealing interface, for bonding the cover glass to the substrate.

3. The image sensor package of claim 2, the adhesive being a glue.

4. The image sensor package of claim 1, the third surface facing away from optical axis of the image sensor, the cover glass including:
   a planar surface facing the second surface; and
   a rim extending away from plane of the planar surface to form an inward-facing surface that faces in direction toward the optical axis.

5. The image sensor package of claim 4, the inward-facing surface having height, in direction parallel to the optical axis, of at least 0.75 millimeters.

6. The image sensor package of claim 5, the second surface having width, along directions away from the optical axis, of no more than 0.45 millimeters.

7. An image sensor package with folded cover-glass sealing interface, comprising:
   an image sensor including a light-receiving surface;
   a substrate including:
      a recessed surface to which the image sensor is bonded,
      a second surface facing in a direction parallel to optical axis of the image sensor, surrounding the recessed surface, and being further than the light-receiving surface from the recessed surface, and
      a third surface facing the optical axis and adjoining and surrounding the second surface; and
   a cover glass bonded to the substrate with a folded sealing interface at the second surface and the third surface, the cover glass being planar and having (a) a bottom surface bonded to the second surface and (b) sides bonded to the third surface;
   wherein (a) width of the second surface, along directions facing away from the image sensor, is no more than 0.5 millimeters, (b) height of the third surface is at least 0.75 millimeters, or (c) the width of the second surface is no more than 0.5 millimeters and the height of the third surface is at least 0.75 millimeters.

8. The image sensor package of claim 7, the height of the third surface being at least 0.75 millimeters and the cover glass having thickness of at least 0.75 millimeters.

9. The image sensor package of claim 7, the substrate including:
   a carrier sub-substrate forming at least a planar top surface and the recessed surface, the recessed surface being recessed from the planar top surface, the planar top surface including the second surface; and
   a dam sub-substrate bonded to portion of the planar top surface adjoining the second surface, the dam sub-substrate having an aperture to form the third surface around the aperture.

10. A method for sealing a cover glass to a substrate of an image sensor package, comprising:
    bonding together a first sub-substrate and a second sub-substrate to form the substrate, the first sub-substrate forming at least a planar top surface and a recessed surface recessed from the planar top surface, the planar top surface including a second surface surrounding the recessed surface, the second surface facing in a first direction, the second sub-substrate having an aperture to form a third surface around the aperture, the third surface facing in second directions substantially orthogonal to the first direction, said bonding including bonding the first sub-substrate to portion of the planar top surface adjoining the second surface;
    bonding an image sensor to the recessed surface such that (a) optical axis of the image sensor is parallel to the first direction and (b) light-receiving surface of the image sensor is closer than the second surface to the recessed surface; and
    sealing the cover glass to the second surface and the third surface, such that the second surface and the third surface accommodate a folded sealing interface between the cover glass and the substrate.

11. The method of claim 10, the step of sealing comprising gluing the cover glass to the third surface and the second surface.

12. The method of claim 10, in the step of sealing, the folded sealing interface being simply connected.

13. The method of claim 10, the step of sealing comprising:
    sealing the second surface to a bottom surface of the cover glass; and
    sealing the third surface to sides of the cover glass.

* * * * *